United States Patent
Tai et al.

(10) Patent No.: US 7,079,677 B2
(45) Date of Patent: Jul. 18, 2006

(54) AUTOMATIC INTELLIGENT YIELD IMPROVING AND PROCESS PARAMETER MULTIVARIATE SYSTEM AND THE ANALYSIS METHOD THEREOF

(75) Inventors: Hung-En Tai, Taipei Hsien (TW); Sheng-Jen Wang, Hsin-Chu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 727 days.

(21) Appl. No.: 10/249,148

(22) Filed: Mar. 19, 2003

(65) Prior Publication Data
US 2004/0001619 A1    Jan. 1, 2004

(30) Foreign Application Priority Data
Jun. 28, 2002    (TW) ................ 91114267 A (51) Int. Cl.
*G06K 9/00* (2006.01)
*G06K 9/36* (2006.01)

(52) U.S. Cl. .................................... 382/145

(58) Field of Classification Search ........... 382/141, 382/144, 145, 147, 168, 172, 173, 218, 228, 382/260, 272, 284, 305; 257/92, 288, 691; 324/750, 751, 763, 765; 327/170, 319, 328, 327/589; 365/200, 201; 702/120; 707/3; 714/724
See application file for complete search history.

(56) References Cited

U.S. PATENT DOCUMENTS

| | | | | |
|---|---|---|---|---|
| 5,770,964 A * | 6/1998 | Suma | ......................... | 327/328 |
| 5,959,913 A * | 9/1999 | Raad | .......................... | 365/201 |
| 5,966,025 A * | 10/1999 | Beffa | .......................... | 324/765 |
| 6,091,290 A * | 7/2000 | Fujioka | ..................... | 327/589 |
| 6,118,711 A * | 9/2000 | Merritt | ...................... | 365/200 |
| 6,198,418 B1 * | 3/2001 | Ishizuka | ..................... | 341/144 |
| 6,314,538 B1 * | 11/2001 | Ochoa et al. | ............... | 714/724 |
| 6,496,433 B1 * | 12/2002 | Okumura et al. | .......... | 365/201 |
| 6,822,267 B1 * | 11/2004 | Okayasu | ..................... | 257/92 |
| 6,952,027 B1 * | 10/2005 | Takizawa | .................... | 257/288 |
| 2004/0001619 A1 * | 1/2004 | Tai et al. | .................... | 382/141 |

* cited by examiner

*Primary Examiner*—Amir Alavi
(74) *Attorney, Agent, or Firm*—Winston Hsu (57) ABSTRACT

An automatic intelligent yield improving and process parameter multivariate analysis system and the analysis method thereof. The system is applied to a computer to set up analysis procedures for analyzing process parameters obtained from each measuring machine in semiconductor testing process by utilizing data mining technology. The system includes a plurality of semiconductor processing nodes having different functions. The system links each of the semiconductor processing node to another semiconductor processing node by a logic means so that the computer can process the semiconductor processing nodes sequentially. The system also links the semiconductor processing nodes by a data connection means to allow microprocessors to load necessary parameter data or wafer lot numbers from corresponding semiconductor processing nodes by a data connection means.

14 Claims, 6 Drawing Sheets

| Testing item | | Testing step | Parameter |
|---|---|---|---|
| LVm10 | → | P1811;E1DN1;E1DT1 | P1K31;E1K41;E1K42 |
| | | 14B01 | 14B01 dosage |
| | | 14B01 | 14B01 dosage |
| | | D83G1 | D8KF1 thk |
| | | D8A1;I8PG1 | D8KP2 P-CONC;I8PG1 P dosage |
| | | P8811;E8D81;E8DQ1 | P8K31;P8K41;P8K42 |
| | | ICPN1 | ICPN1 dosage |
| | | DFLD1;EFD31 | DFKF2 thk |
| | | IFA11 | IFA11 dosage |
| | | IHPS1 | IHPS1 dosage |

AUTOMATIC INTELLIGENT YIELD IMPROVING AND PROCESS PARAMETER MULTIVARIATE SYSTEM AND THE ANALYSIS METHOD THEREOF

BACKGROUND OF INVENTION

1. Field of the Invention

The present invention relates to electronics, and more particularly, to an automatic intelligent yield improving and process parameter multivariate analysis system and the analysis method thereof by utilizing data mining technology.

2. Description of the Prior Art

In a semiconductor manufacturing process, each set of processes requires a large number of equipment to deal with complicated procedures. Therefore, engineers are concentrated on ensuring the proper operation of equipment, sustaining or improving production yield rate, detecting and verifying problems, and periodically maintaining facilities for production, etc, so as to maintain the company''s operation in optimum conditions.

With the progress of technologies, the complexities of processing are raised and the amount of data is increased to such an extent that tracing and discovering processing problems becomes even more difficult. Although computers and statistical anaysis means are utilized, the prior art data mining method, having no filter mechanism, does not work well in analyzing process parameters because the singularity of processing, the large amount of data, and the complex modules of equipment result in too large an amount of data. Consequently, the characteristic feature of each parameter is not revealed. As a result, the analysis results are fruitless, exhaust manpower to process, and require experts from different areas to analyze.

Since there is no complete set of design of analysis recipes and strict definition for statistical analysis, the analysis results are determined according to humans experience. As a result, the accuracy and the confidence level of the final analysis results are open to question. Furthermore, the human affairs in semiconductor manufacturing change frequently. Engineer''s personal experience is difficult to transfer. The capacity of each engineer is limited, meaning the engineer is unable to look after the operation status of all of the equipment. When the testing results indicate abnormalities, it is thus difficult for engineers, lacking in experience, to judge which point causes the problem to occur. Therefore, a lot of time is consumed to redo related research, and even worse, wrong decisions are made. This will not only increase the cost, but also can not improve the on-line production status in time, making the prior art method unsuitable for semiconductor industry, which upholds high efficiency and high yield rate.

It is therefore very important to provide a complete and effective intelligent decision-making system to assist engineers with trouble-shooting and making right decisions.

SUMMARY OF INVENTION

It is a primary objective of the claimed invention to provide an automatic intelligent yield improving and process parameter multivariate analysis system and the analysis method thereof to design multivariate related analysis recipes conforming to different analysis requirements by utilizing data mining technology. Each of the analysis recipes has high flexibility so the analysis recipes can be combined freely, or revised by adding or deleting nodes of the process recipes by automatic means to improve the accuracy, the confidence level, the integrity, the reusability, the repeatability, and the multi-function combinations.

It is another primary objective of the claimed invention to provide an automatic intelligent yield improving and process parameter multivariate analysis system and the analysis method thereof to set up an artificial intelligent analysis structure. By utilizing a composite multivariate analysis method, computers are able to handle multivariate analysis of the process parameters automatically and rapidly to improve the drawbacks incurred from analysis according to human''s experience so as to improve the efficiency of analysis and improve the completeness of analysis processing.

It is yet another primary objective of the claimed invention to provide an automatic intelligent yield improving and process parameter multivariate analysis system and the analysis method thereof to automatically filter and analyze the process parameters conforming to the preset conditions so as to reveal the characteristic feature of each parameter.

The claimed invention automatic intelligent yield improving and process parameter multivariate analysis system is applied to a computer to set up a plurality of analysis recipes for analyzing parameter data obtained from a plurality of measuring machines used for measuring a plurality of wafers in semiconductor testing process. The computer comprises a database for storing the parameter data and wafer lot numbers of the wafers. The claimed invention system comprises a plurality of semiconductor processing nodes, a logic connection means, and a data connection means.

The plurality of semiconductor processing means comprises a lot query node, a lot split node, a lot merge node, a data query node, and a statistical node. The query node is for searching for the wafer lot numbers conforming to a lot number searching condition from the database by inputting the lot number searching condition into the lot query node. The lot split node is for dividing a group comprising a plurality of wafer lot numbers into a plurality of sub groups according to a lot split condition input into the lot split node. The lot merge node is for merging a plurality of wafer lot numbers to form a group according to a merge condition input into the lot merge node. The data query node is for searching for the parameter data corresponding to a data query condition from the database by inputting the data query condition into the data query node. The statistical node is for receiving the parameter data and providing at least one statistical calculation method to analyze the parameter data. The logic connection means is for connecting two semiconductor processing nodes to produce a sequence between the semiconductor processing nodes so as to allow the computer to execute the commands of the semiconductor processing nodes sequentially. A data connection means is for producing a data connection between two of the semiconductor processing nodes so as to allow one of the semiconductor processing nodes to load the parameter data or wafer lot numbers from another semiconductor processing node.

The claimed invention method of designing analysis recipes applied in the above-mentioned system comprises: (A) receiving and recording a command loaded from the semiconductor processing node; (B) receiving and recording a preset condition sent from the semiconductor processing node; (C) receiving a command loaded from the logic connection means; (D) producing a sequence between two semiconductor processing nodes according to the logic connection means; (E) receiving a command loaded from the data connection means; and (F) producing a data connection between two semiconductor processing nodes according to the data connection means.

It is an advantage of the claimed invention that the design of the claimed invention method is innovative. Therefore, the function is improved when applying the claimed invention method to the industry.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
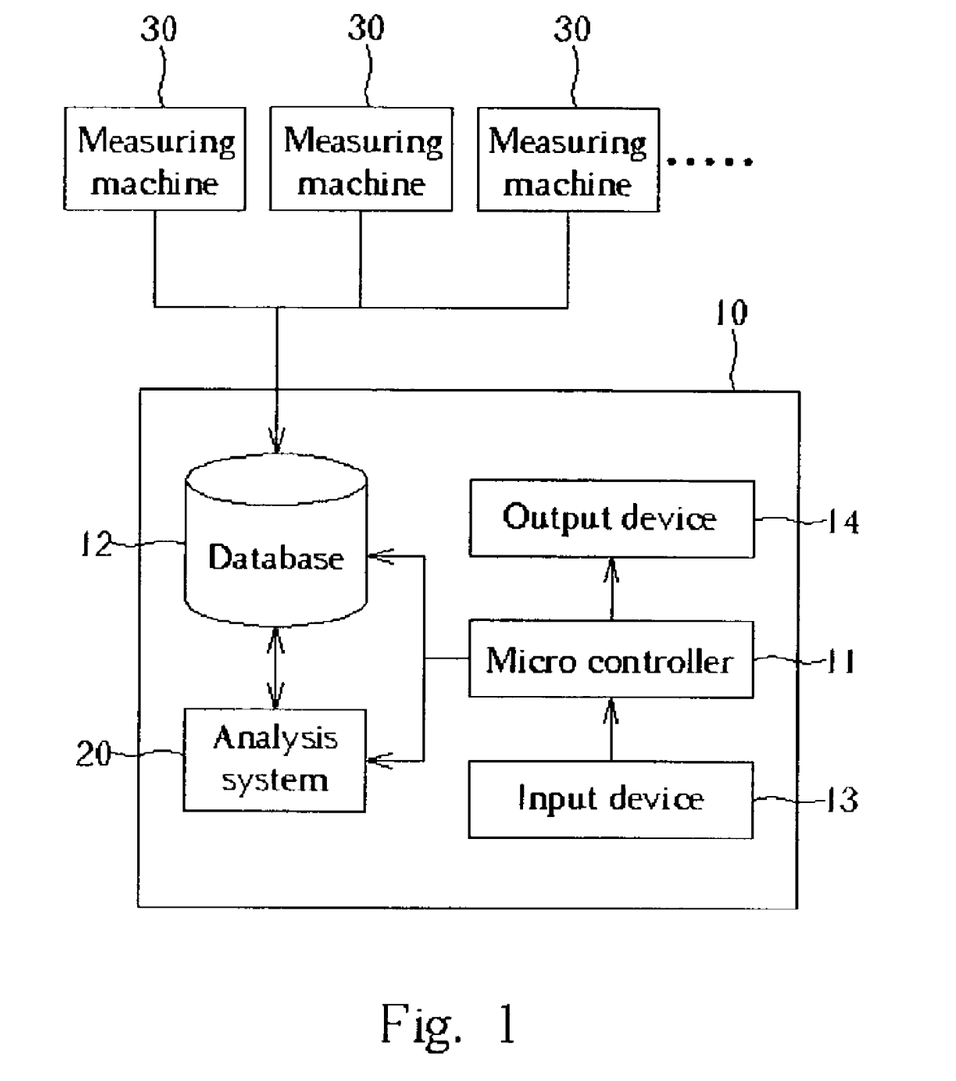
FIG. 1 is a system configuration chart according to the present invention.

Please refer to FIG. 1, which is a system configuration chart according to the present invention. The present invention automatic intelligent yield improving and process parameter multivariate analysis system (called system 20 hereinafter) is applied to a computer 10 in semiconductor factory for designing various analysis recipes to analyze various conditions occurring during the testing process in semiconductor manufacturing. In other words, the system 20 is for analyzing parameter data, obtained from detecting lots of wafers by each measuring machine 30 in the semiconductor testing process, and recording a wafer lot number corresponding to each lot of wafers.

As shown in FIG. 1, the computer 10, being the same as a common computer, comprises a micro controller 11, a database 12, an input device 13, and an output device 14. The database 12 is connected to the on line measuring machines 30. Therefore, the database 12 loads and saves the parameter data related to wafer testing and wafer lot numbers corresponding to the tested wafers sent from each measuring machine 30. Input device 13 is optimally a keyboard, or may be a hand writing input device or a voice input device. Output device 14 may be a device for outputting the operation results of the micro controller 11, such as a terminal, or a printer, etc.

Figure 2:
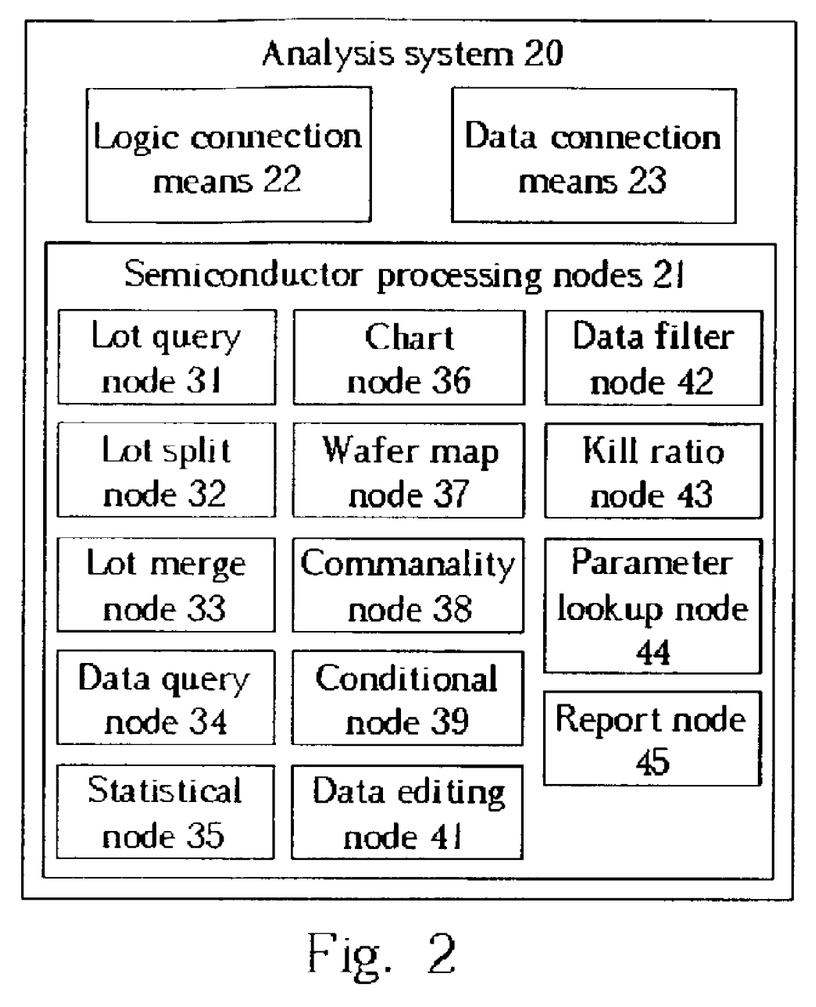
FIG. 2 is a schematic diagram of an analysis system applied to the computer according to the present invention.

Please refer to FIG. 2, which is a schematic diagram of an analysis system 20 applied to the computer 10 according to the present invention. As shown in FIG. 2, the analysis system 20 comprises semiconductor nodes 21, a logic connection means 22, and a data connection means 23. In the semiconductor processing nodes 21, a plurality of nodes having different functions are defined. The plurality of nodes can receive preset conditions input from the input device 13 by users so the micro controller 11 can operate according to the preset conditions.

In the following, the function of each of the semiconductor processing nodes 21 is narrated according to the present invention. A lot query node 31 is used to search for the wafer lot numbers conforming to a lot number searching condition from the database 12, by inputting the lot number searching condition into the lot query node 31 by users.

A lot split node 32 is used to divide existing wafer lot numbers into groups according to a lot split condition input into the lot split node 32 by users.

A lot merge node 33 is used for merging two (or more) wafer lot numbers to form a group according to a merge condition input into the lot merge node 33 by users to allow the micro controller 11 to perform subsequent integrated operations.

A data query node 34 is used for searching for the parameter data according to a data query condition from the database.

A statistical node 35 is used to instruct the micro controller 11 to receive the above mentioned parameter data, and analyze the characteristic feature of the parameter data according to the statistical calculation method selected by users. The statistical calculation method comprises calculating an average of the parameter data, calculating a standard deviation of the parameter data, and other related statistical methods which may be increased or decreased according to the related requirements of process analysis.

A chart node 36 is used to provide statistical charts, such as a control chart, a histogram chart, a polygon chart, or a radar chart, etc, so the users can click to select the statistical charts corresponding to the parameter data.

A wafer map node 37 is used for plotting wafer maps, such as defect distribution map, bin sort map, etc, and providing display methods, such as a single wafer map, multiple wafer maps, or composite wafer map. By utilizing the method of comparing and overlapping, an operlapping ratio is calculated. The wafer map, which originally can not be expressed with quantitative data (the parameter data), is quantitized to allow the statistical node to operate.

A commonality analysis node 38 is used to analyze commonality between wafers having different wafer lot numbers. For example, whether the wafers pass through the same measuring equipment 30 during testing process or not.

A conditional node 39 is used to decide which of the subsequent processing nodes 21 should the micro controller 11 go to sequentially.

A data editing node 41 is used to produce new variables. For example, when a, b are known parameters, the data editing node 41 produces variables.

A data filter 42 node is used for selecting parameter data, conforming to a filtering condition input into the data filter node 42 by users, to delete unnecessary parameter data so as to lessen the loading of the micro controller 11. For example, when the number of variables exceeds a critical value, this data is deleted.

A kill ratio node 43 is used to calculate a kill ratio when the measuring machines 30 detect that the wafers have defects.

Figure 5:
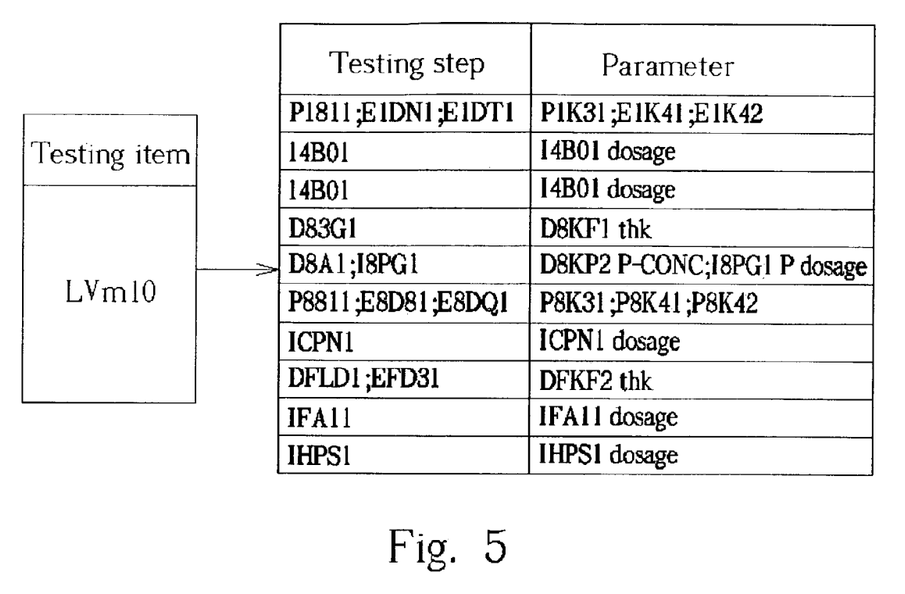
FIG. 5 is a schematic diagram of a contrastive table according to the present invention.

A parameter lookup node 44 is used to define a correspondence between the parameter data. Please refer to FIG. 5, which is a schematic diagram of a contrastive table according to the present invention. When performing sample tests in a semiconductor quality control (QC), the testing steps and the parameters corresponding to an item "LVtn10" can be obtained from the contrastive table. Each of the semiconductor testing processes corresponds to a contrastive table.

A report node 45 is used for outputting the analysis results obtained from the micro controller 11 through the output device 14. For example, when the output device 14 is a printer, report forms are printed out; when the output device 14 is a monitor, the results are displayed on the screen. In addition, the report node 45 provides an editing function to allow users to edit or revise the report forms.

A logic connection means 22 of each analysis system 20 is used for connecting two semiconductor processing nodes 21 to produce a sequence between two semiconductor processing nodes 21 to allow the micro controller 11 to recognize operation sequence and execute the commands of the semiconductor processing nodes 21 sequentially.

A data connection means 23 of the analysis system 20 is used for producing a data connection between two semiconductor processing nodes 21 to allow one of the semiconductor processing nodes 21 to load the parameter data or wafer lot numbers from another semiconductor processing node 21. For example, the fourth semiconductor processing node 21 may load the parameter data from the first semiconductor processing node 21 by the data connection means 23.

According to the above mentioned analysis system 20, users may design analysis recipes freely to achieve different analysis objectives. Please refer to FIG. 3, which is a flow chart for designing an analysis recipe according to the present invention.

Figure 3:
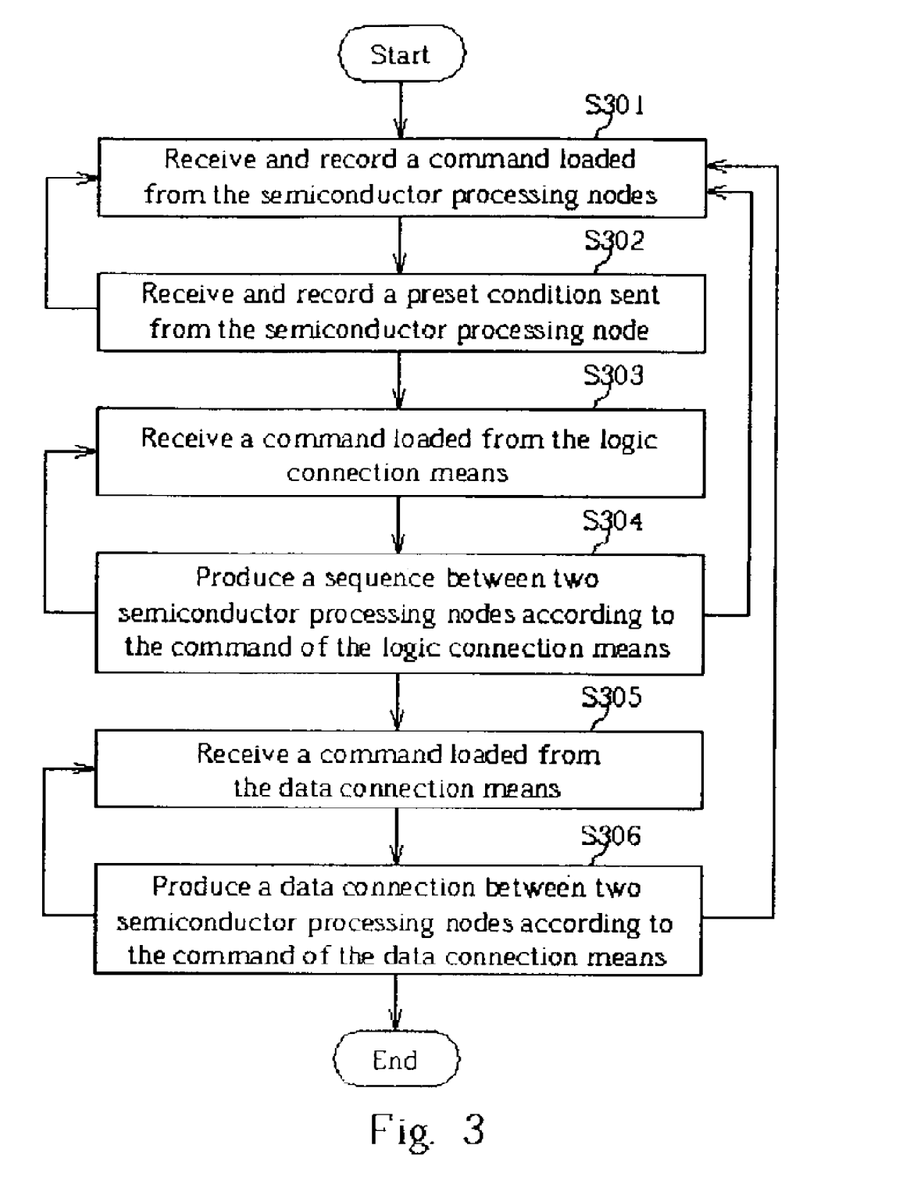
FIG. 3 is a flow chart for designing an analysis recipe according to the present invention.

When users start an analysis recipe, one of the semiconductor processing nodes 21 is selected from the analysis system 20. Therefore, the micro controller 11 receives and records a command loaded from the semiconductor processing nodes 21 (step S301). When a preset condition is input into the semiconductor processing nodes 21 through the input device 13, the micro controller 11 receives and records this preset condition (step S302). If users key in data not conforming to the formats, the micro controller 11 will produce an error message to ask users to re-input the preset condition. When users select two or more semiconductor processing nodes 21, the operation sequence can be defined. The semiconductor processing nodes 21, having a sequence of the previous and the next, thus can be connected by the logic connection means 22 to allow the micro controller 11 to receive a command sent from users (step S303), and set up sequence between the semiconductor processing nodes 21 according to the command. Since the operation data of one of the semiconductor processing nodes 21 does not necessarily come from the previous semiconductor processing node 21, the micro controller 11 can receive a command loaded from the data connection means 23 input by users as well (step S305). A data connection is therefore produced between two semiconductor processing nodes 21 (step S306) to allow the micro controller 11 to load necessary data according to the data connection means 23.

Figure 4:
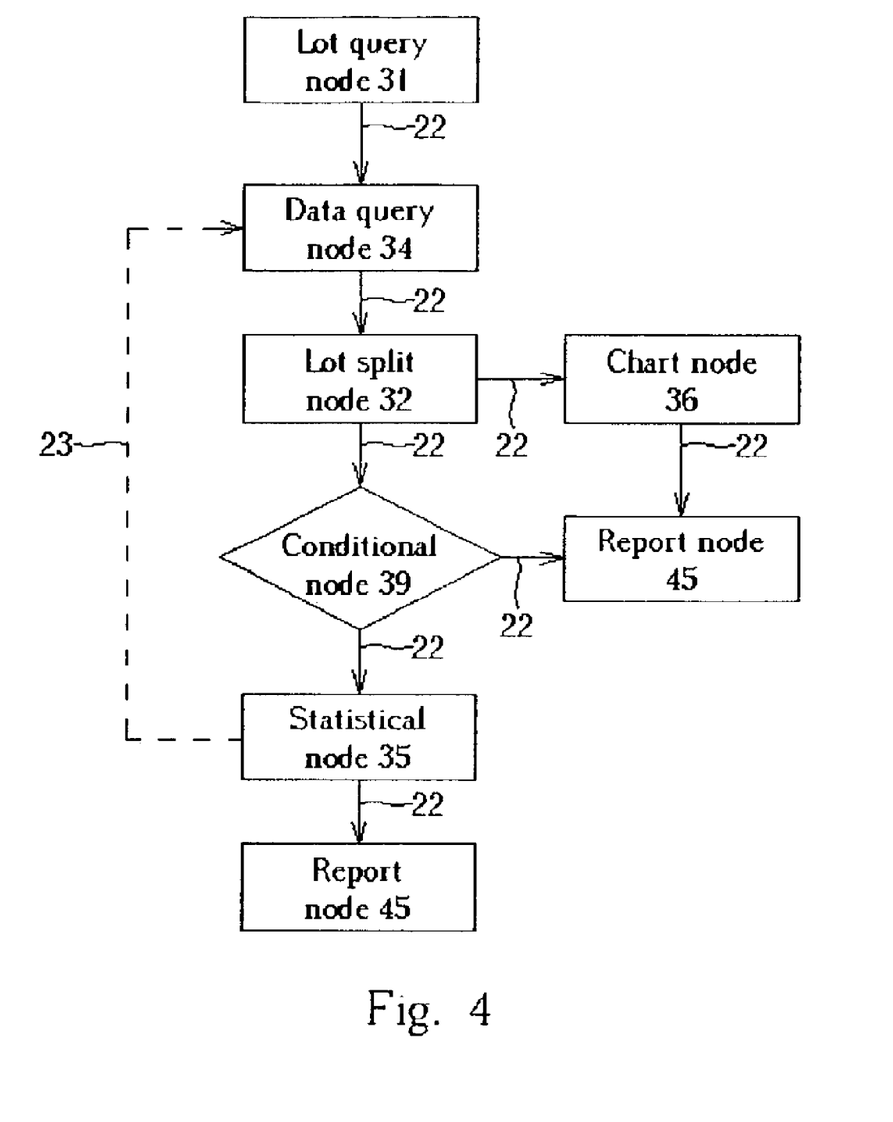
FIG. 4 is a flow chart of an analysis recipe I designed according to the present invention.

In order to suit other users convenience, the analysis recipes are stored in the database 12 and are utilized repeatedly to avoid the effort resulting from re-designing a set of analysis recipe every time. Each analysis recipe is executed by an automatic method to ensure the consistence, repeatability, and accuracy of each calculation result. Please refer to FIG. 4, which is a flow chart of an analysis recipeI designed according to the present invention. As shown in FIG. 4, each semiconductor processing node 21 is connected to another semiconductor processing node 21 by the logic connection means 22 to allow the micro controller 11 to process the lot query node 31, the data query node 34, and the lot split node 32 sequentially. Two routes are differentiated at the lot split node 32 to deal with the chart node 36 and the conditional node 39 separately. When the chart node 36 completes processing, results are produced at the report node 45. At the conditional node 39, a subsequent route is determined according to a preset condition input by users. Because the data of the statistical node 35 comes from the parameter data searched by the data query node 34, these two nodes are connected by a data connection means.

Figure 6:
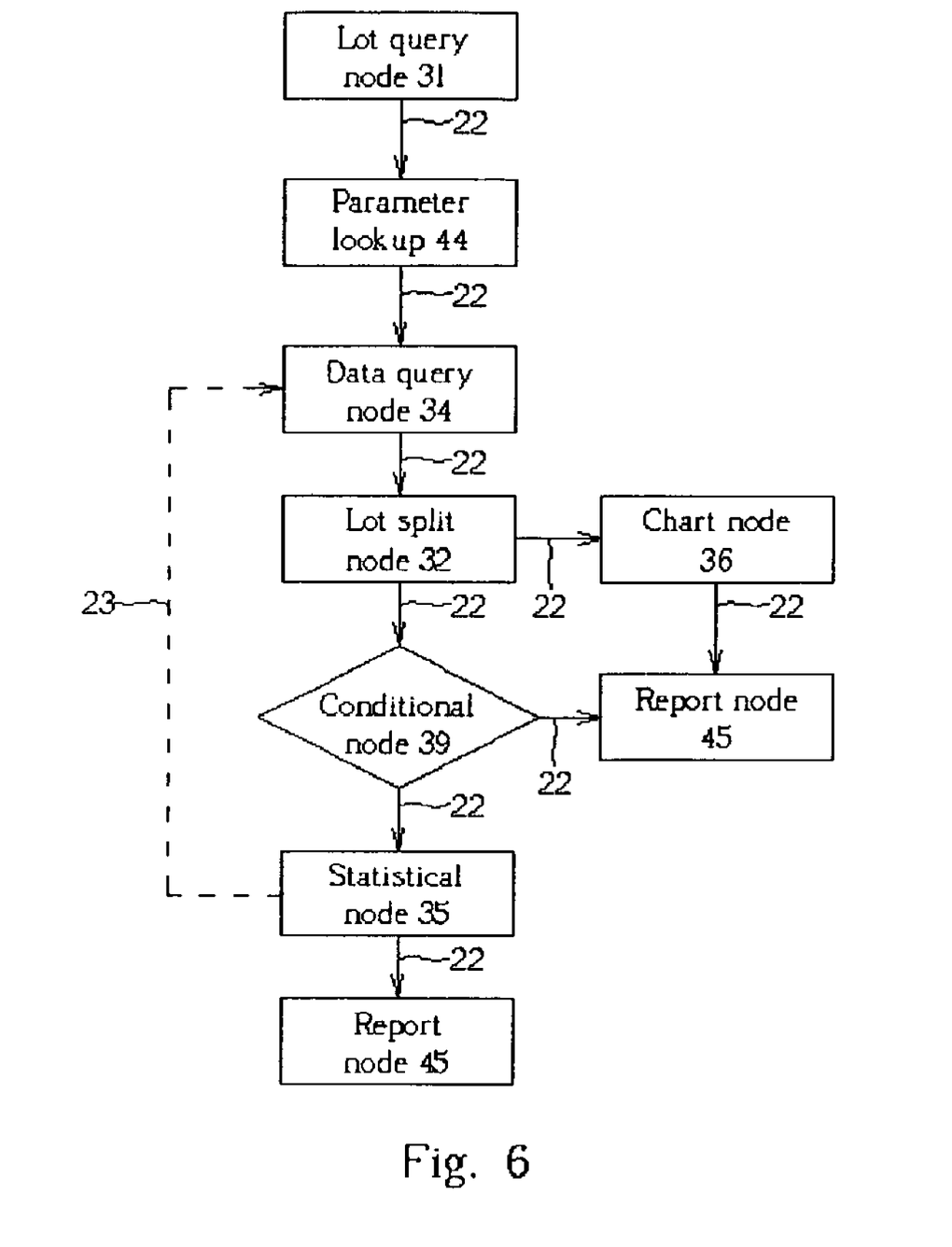
FIG. 6 is a flow chart of analysis recipe II designed according to the present invention.

Please refer to FIG. 6, which is a flow chart of analysis recipe II designed according to the present invention. As shown in FIG. 6, analysis recipe II and analysis recipe I are about the same, except the parameter lookup node 44 is inserted between the lot query node 31 and the data query node 34. Therefore, the micro controller 11 is linked with the contrastive table, similar to the contrastive table shown in FIG. 5, to obtain the corresponding parameter data and delete unnecessary operation data, and then executes the command of the data query node 34. As a result, the singularity of parameter data is readily highlighted to increase the accuracy or analysis results.

The present invention automatic intelligent yield improving and process parameter multivariate analysis system and the analysis method thereof designs analysis recipes fulfilling different objectives or having different functions. By setting up different conditions, the parameter data conforming to the analysis recipes are filtered. In addition, various analysis recipes are freely combined to accelerate recipe design. Furthermore, the content of nodes in the analysis recipes can be added, deleted, or revised according to the objective of analysis to entitle the present invention to great flexibility and multi-function combinations. The present invention combines a parameter data multivariate analysis method with data mining technology to set up a complete set of automatic intelligent analysis modes to allow yield rate evaluation and yield rate improvement to be performed automatically. Therefore, the analysis efficiency is highly improved. The drawbacks resulting from human analysis are improved to eliminate errors caused from different persons. The loading of computer equipment is lessened.

In summary, the present invention automatic intelligent yield improving and process parameter multivariate analysis system designs analysis recipes freely, according to different objectives (such as the yield rate management in semiconductor wafer manufacturing), to accelerate analysis recipe design and incorporate the execution of the analysis recipes to improve the management of yield rate. The analysis recipes stored in the present invention system can be utilized, at a fixed time or not at a fixed time, repeatedly to improve the management of yield rate in semiconductor wafer fabrication. In addition, the content of analysis recipes stored in the present invention system can be revised, according to the analysis objective, by adding or deleting nodes any time to increase the flexibility of revising and utilizing. Since only adding and deleting nodes are required when performing analysis recipe revision, the time required for revision is shortened. The efficiency for revising analysis recipes is highly improved. The discrepancies resulting from different persons are eliminated by utilizing the present invention system, which is based on analysis recipes, to greatly improve the consistence and accuracy of analysis and reports.

The objective, means, and functioning of the present invention method are totally different from the prior art method. Therefore the present invention method is very useful and valuable. Those skilled in the art will readily observe that numerous modifications and alterations of the system and the method may be made while retaining the teachings of the invention. Accordingly, the above disclosure should be construed as limited only by the metes and bounds of the appended claims.

What is claimed is:

1. An automatic intelligent yield improving and process parameter multivariate analysis system applied to a computer to set up a plurality of analysis procedures for analyzing parameter data obtained from a plurality of measuring machines used for measuring a plurality of wafers in semiconductor testing process, the computer comprising a database for storing the parameter data and wafer lot numbers of the wafers, the system comprising:

a plurality of semiconductor processing nodes, the semiconductor processing nodes comprising:

a lot query node for searching for the wafer lot numbers conforming to a lot number searching condition from the database by inputting the lot number searching condition into the lot query node;

a lot split node for dividing a group comprising at least one wafer lot number into a plurality of sub groups according to a lot split condition input into the lot split node;

a lot merge node for merging a plurality of wafer lot numbers to form a group according to a merge condition input into the lot merge node;

a data query node for searching for the parameter data corresponding to a data query condition from the database by inputting the data query condition into the data query node; and a statistical node for receiving the parameter data and providing at least one statistical calculation method to analyze the parameter data;

a logic connection means for connecting two semiconductor processing nodes to produce a sequence between the semiconductor processing nodes to allow the computer to execute the commands of the semiconductor processing nodes sequentially; and a data connection means for producing a data connection between two of the semiconductor processing nodes to allow one of the semiconductor processing nodes to load the parameter data or wafer lot numbers from another semiconductor processing node.

2. The system of claim 1, wherein the statistical calculation method provided by the statistical node comprises calculating an average of the parameter data.

3. The system of claim 1, wherein the statistical calculation method provided by the statistical node comprises calculating a standard deviation of the parameter data.

4. The system of claim 1, wherein the semiconductor processing nodes further comprise a chart node for plotting statistical charts including the parameter data and the wafer lot number.

5. The system of claim 1, wherein the semiconductor processing nodes further comprise a wafer map node for plotting wafer maps of the wafers and providing display methods for the wafer maps.

6. The system of claim 1, wherein the semiconductor processing nodes further comprise a commonality analysis node for analyzing commonality between wafers having different wafer lot numbers.

7. The system of claim 1, wherein the semiconductor processing nodes further comprise a conditional node, the conditional node is connected to at least two subsequent semiconductor processing nodes by at least two logic connection means, and the conditional node is for deciding which of the subsequent semiconductor processing nodes is the semiconductor processing node to be connected to.

8. The system of claim 1, wherein the semiconductor processing nodes further comprise a data editing node for producing new variables in the parameter data.

9. The system of claim 1, wherein the semiconductor processing nodes further comprise a data filter node for deleting parameter data conforming to a filtering condition input into the data filter node.

10. The system of claim 1, wherein the semiconductor processing nodes further comprise a kill ratio node for calculating a kill ratio when the measuring machines detect that the wafers have defects.

11. The system of claim 1, wherein the semiconductor processing nodes further comprise a parameter lookup node for defining a correspondence between the parameter data.

12. The system of claim 1, wherein the semiconductor processing nodes further comprise a report node for outputting the analysis results obtained from the operation according to the analysis procedures.

13. A method of designing an analysis procedure utilized in an automatic intelligent yield improving and process parameter multivariate analysis system executed in a computer, the system comprising a plurality of semiconductor processing nodes, a logic connection means, and a data connection means, each semiconductor processing node being input with a preset condition to allow the computer to perform an operation according to the preset condition, the logic connection means being used for connecting two semiconductor processing nodes to produce a sequence between the semiconductor processing nodes, the data connection means being used for producing a data connection between two semiconductor processing nodes to allow one of the semiconductor processing nodes to load the parameter data or wafer lot numbers corresponding to another semiconductor processing node, the method comprising:

(A) receiving and recording a command loaded from the semiconductor processing node;

(B) receiving and recording a preset condition sent from the semiconductor processing node;

(C) receiving a command loaded from the logic connection means;

(D) producing a sequence between two semiconductor processing nodes according to the logic connection means;

(E) receiving a command loaded from the data connection means; and (F) producing a data connection between two semiconductor processing nodes according to the data connection means.

14. The method of claim 13, wherein the analysis procedure is stored in a database of the computer after step (F).

* * * * *